US007458846B2

(12) United States Patent
Loehr et al.

(10) Patent No.: US 7,458,846 B2
(45) Date of Patent: Dec. 2, 2008

(54) ELECTRICAL POWER SERVICE APPARATUS WITH EXTERNAL CIRCUIT BREAKER ROCKER SWITCH RESET

(75) Inventors: Karl Loehr, Commerce Township, MI (US); Darrell Robinson, Highland, MI (US); Allen Pruehs, Howell, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 106 days.

(21) Appl. No.: 11/668,516

(22) Filed: Jan. 30, 2007

(65) Prior Publication Data

US 2008/0180885 A1 Jul. 31, 2008

(51) Int. Cl.
*H02B 1/00* (2006.01)
(52) U.S. Cl. ...................... 439/517; 361/663
(58) Field of Classification Search ............... 439/146, 439/517; 361/659, 661, 663, 668
See application file for complete search history.

(56) References Cited

U.S. PATENT DOCUMENTS

| 1,957,498 A | * | 5/1934 | Hamill ...................... 324/157 |
|---|---|---|---|
| 3,031,640 A | | 1/1962 | McKee |
| 3,221,216 A | | 11/1965 | Kobryner |
| 3,596,234 A | | 7/1971 | Supienza |
| 4,772,213 A | | 9/1988 | Bell et al. |
| 4,977,482 A | | 12/1990 | Patton |
| 5,023,747 A | | 6/1991 | Lindsay |
| 5,088,004 A | | 2/1992 | Howell |
| 5,145,403 A | | 9/1992 | Schaffert et al. |
| 5,145,422 A | | 9/1992 | Fry |
| 5,181,166 A | | 1/1993 | Howell |
| 5,572,396 A | * | 11/1996 | Robinson .................... 361/117 |
| 6,104,586 A | | 8/2000 | Robinson |

OTHER PUBLICATIONS

Ekstrom Industries, Inc., "Service Limiter Adapter", Ekstrom bulletin, 4 pages, Farmington Hills, Michigan.
Ekstom Industries, Inc., "Temporary Metered Power Device", Models TMP-2600 and TMP-2649, 1 page, Ekstrom bulletin, Farmington Hills, Michigan.
Scientific Atlanta Instrumentation Group, "Service Reconnect Device Series SRD-S1900", 4 pages, Scientfic -Atlanta, Inc. bulletin, USA.
Ekstrom Industries, Inc., Relay and Switch Adapters Series 37 and 700, five models, 1 page, Ekstrom bulletin, Farmington Hills, Michigan.

* cited by examiner

*Primary Examiner*—Neil Abrams
(74) *Attorney, Agent, or Firm*—Young Basile, PC

(57) ABSTRACT

A watthour meter socket adapter includes a housing having internal jaw contacts and external blade terminals. A power switch is electrically connected between the jaw contacts and the blade terminals. A rocker member on the power switch faces a side of the housing. An actuator is mounted in the housing and has a first end coupled to the rocker member for simultaneous movement of the rocker member and the actuator. A second end of the actuator extends through an aperture in the side of the housing allowing external manipulation of the actuator and the rocker member to indicate and/or manipulate the on and off state of the power switch. An electrically insulating safety shield may be mounted over the exposed portions of the jaw contacts and the conducting elements in the housing. Optional lock features may be provided to lock the actuator in the "on" or "off" positions.

21 Claims, 6 Drawing Sheets

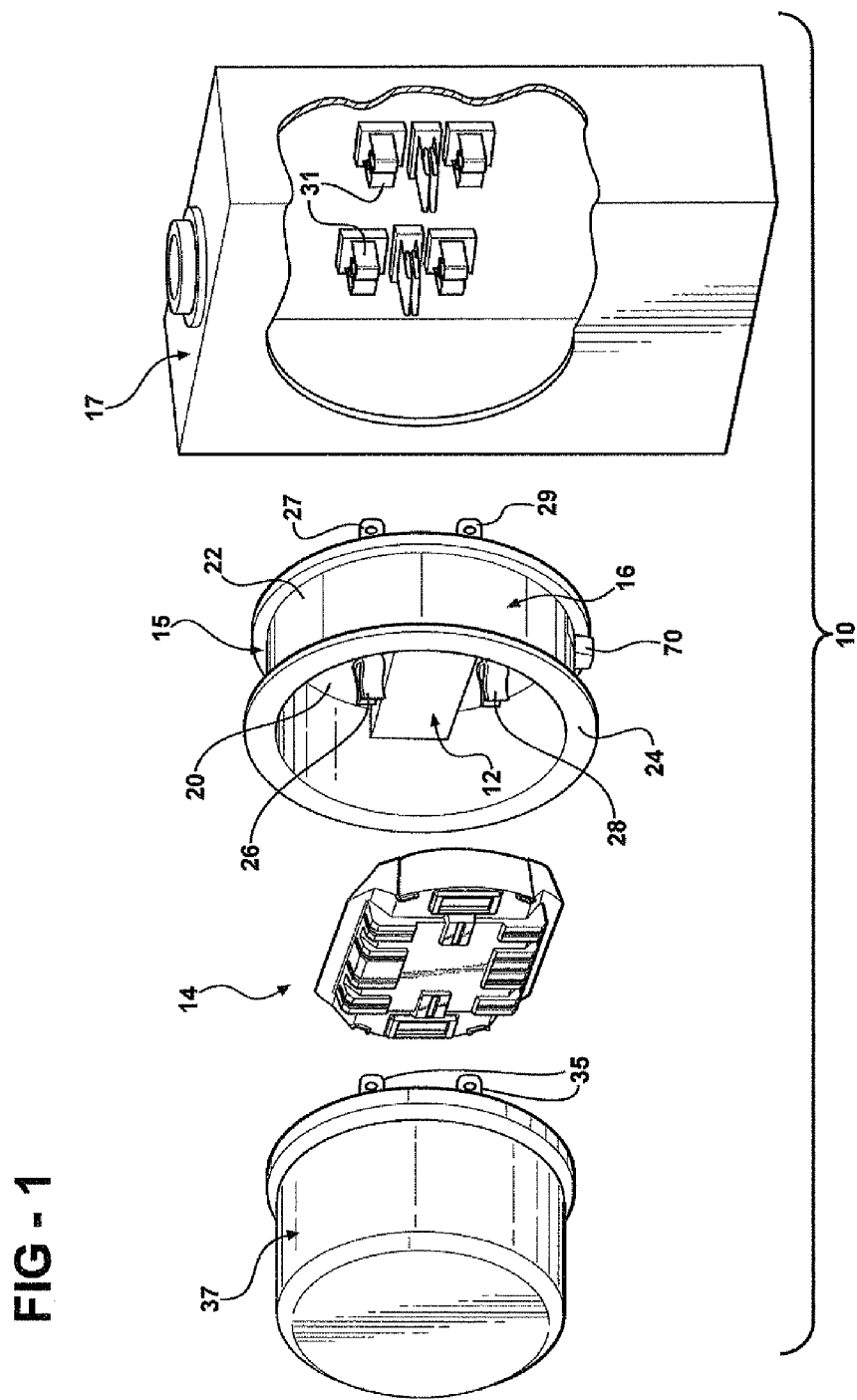

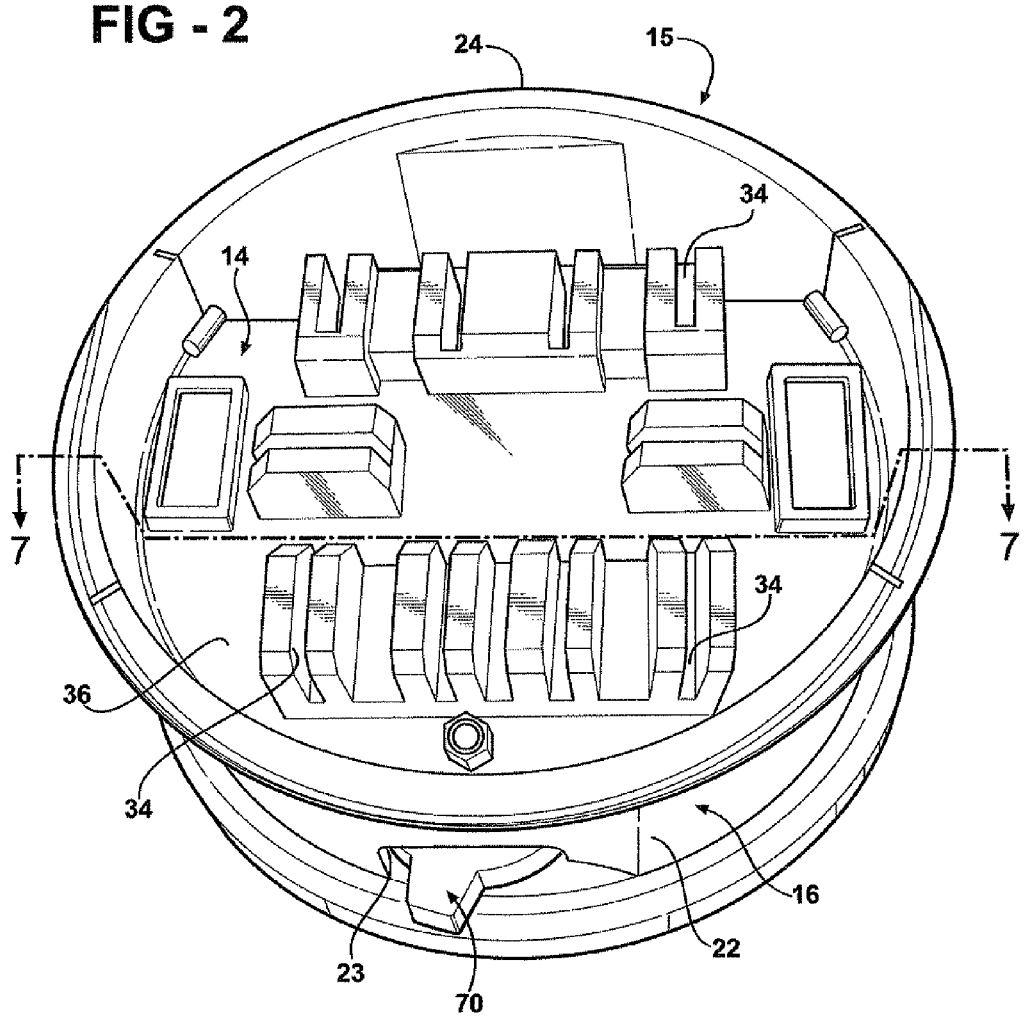

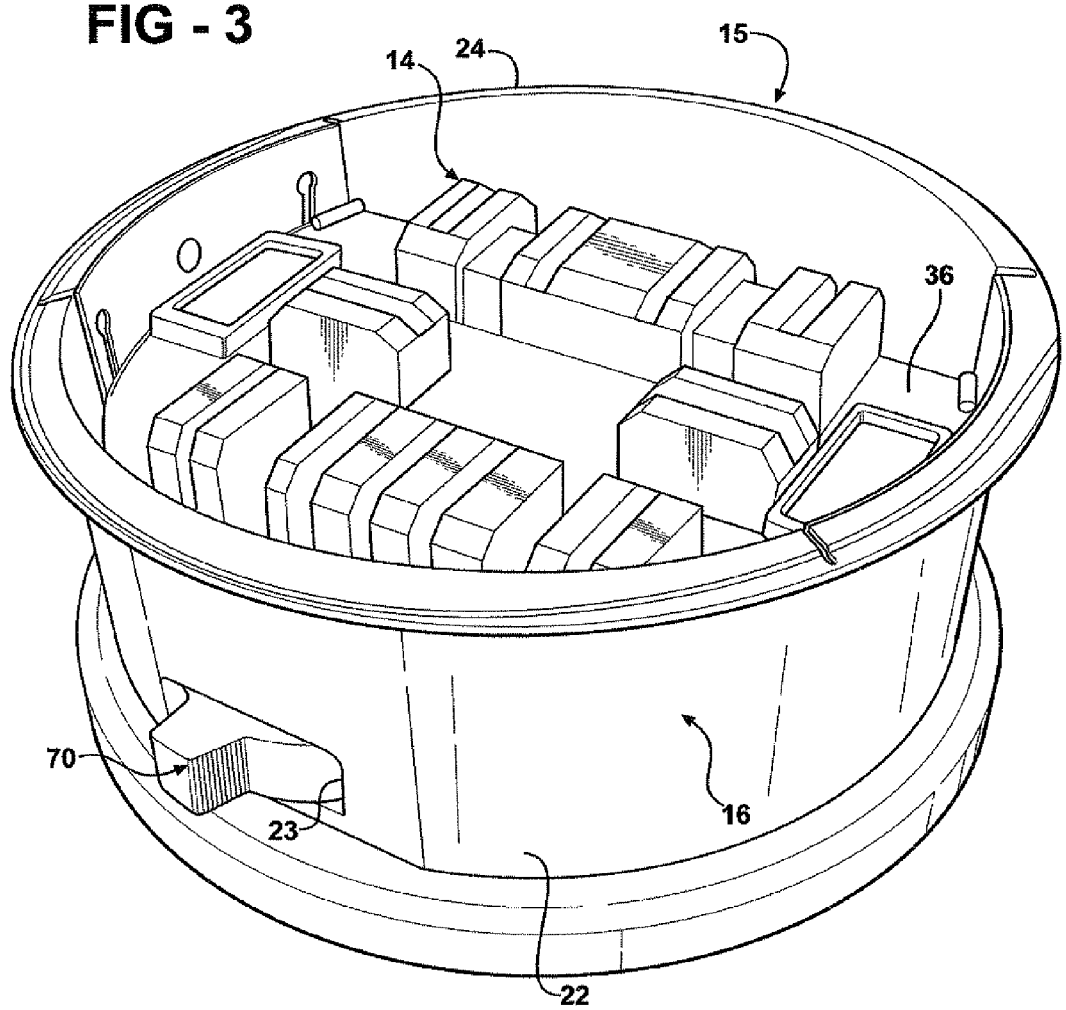

ELECTRICAL POWER SERVICE APPARATUS WITH EXTERNAL CIRCUIT BREAKER ROCKER SWITCH RESET

BACKGROUND

The present invention relates, in general, to electrical power service apparatus and, particularly, to electrical watthour meter and meter socket installations and, even more particularly, to watthour meter socket adapters which mount a plug-in watthour meter in a meter socket.

Electrical power is supplied to an individual site or service by external electrical power line conductors located above or below ground. In a conventional arrangement, electrical power line conductors are connected to contacts in a watthour meter socket mounted on a building wall. Electrical load conductors are connected to another set of contacts in the socket and extend to the electrical distribution network in the building. A watthour meter is plugged into the contacts in the meter socket to measure the electric power drawn through the load conductors.

Due to the increased use of plug-in watthour meters, socket adapters have been devised which convert A-base type bottom connected watthour meter sockets to receive plug-in watthour meters. Another type of socket adapter has been devised which allows the installation of other devices between the watthour meter socket and a plug-in watthour meter Such watthour meter socket adapters have also been provided with power disconnect devices, such as circuit breakers or ground fault circuit interrupters, both for protecting the electrical service as well as, in certain applications, to limit the amount of power supplied to the site. Such power disconnect devices may include an elongated plunger coupled to the on/off switch on the power disconnect device. The end of the plunger extends outwardly through an opening in the sidewall of the socket adapter when the circuit breaker is in the open or power disconnected position. The exposed end of the plunger can be pushed inward through the sidewall of the watthour meter socket adapter to close the circuit breaker and to reapply power to the site. In certain of these devices, the ends of the plungers extending through the sidewall of the adapter have been colored red for high visibility of a tripped or open condition of the circuit breaker, etc.

Safety shields have also been devised which mount in the socket adapter housing over the jaw contacts. Such shields have apertures aligned with the jaw contacts to allow the blade terminals of an electrical power service device, such as a watthour meter, to extend through the shield and into engagement with the jaw contacts. The shield covers all exposed portions of the jaw contacts and other electrical conducting elements in the socket adapter to prevent inadvertent contact by the service person when the watthour meter is disconnected from the jaw contacts.

Previously devised electrical power service apparatus with internally mounted power switching devices, such as circuit breakers or ground fault circuit interrupters, have space problems when it is desirable to employ a safety shield in such adapters. Some power disconnect devices have a cubical shape with, when in a normal mounting position within the adapter housing, a height greater than the width. This places the on/off rocker switch mounted on the front surface of the power disconnect device and the front surface itself a considerable distance from the back wall or base of the socket adapter. When a safety shield is mounted over the jaw contacts and the power disconnect device, the safety shield can be in an interference position with the back wall of the watthour meter. To avoid such interference, portions of the safety shield are cut away to enable full insertion of the watthour meter blade terminals into the jaw contacts in the meter socket. However, this sacrifices the full shielding capabilities of the shield by exposing portions of the conducting elements of the socket adapter, thereby rendering a safety shield less effective in isolating the electrical power conducting components in the socket adapter from the installer.

It is also known to add connecting members to a power switch or power disconnect switch mounted in a socket adapter housing which couples the pivotal rock on/off rocker switch on the front surface of the power disconnect switch to a linearly movable shaft or plunger, a portion of which extends through an opening in the sidewall of the socket adapter housing. This provides external manipulation of the on/off switch of the power disconnect to reconnect electric power after a disconnection or to manually disconnect power from the service site. While the plunger has proven effective at providing an external on and off capability for a power switch mounted in a socket adapter housing, it is believed that a more robust and easily used design is desirable.

Thus, it would be desirable to provide an electrical power service apparatus which includes a power disconnect device which overcomes the problems of similar previously devised apparatus. It would also be desirable to provide an electrical power surface apparatus which has a compact mounting of a power disconnect device and a safety shield to permit installation of a watthour meter into engagement with the adapter jaw contacts without modification to the safety shield and at the same time, providing a robust and easy to use external actuation of the power disconnect device.

SUMMARY

An electrical watthour meter socket adapter mountable in a meter socket having a plurality of jaw contacts and receiving a watthour meter includes a housing having a base and a sidewall. A power switch is disposed in the housing having a pivotal rocker member. An actuator is pivotally disposed in the housing. The actuator has a first portion coupled to the rocker member of the power switch for joint movement with the actuator. The actuator has a second portion, at least a portion of which extends through an aperture in the sidewall of the adapter housing and terminates in a user engagable member.

In one aspect the user engagable portion of the actuator is a lever.

In one aspect, the first portion of the actuator includes an arm having a rocker switch engagement feature for movement of the rocker member of the power switch with movement of the actuator.

The actuator may have a stem pivotally disposed in the housing. A sleeve extends from the base of the housing. The stem is pivotally disposed about the sleeve.

A safety shield may be disposed in the housing over and around the jaw contacts. Apertures formed in the shield allow passage of watthour blade terminals through the shield and into engagement with the jaw contacts in the housing. An aperture is formed in a side of the shield. The second portion of the actuator extends through the aperture in the side portion of the shield.

A plurality of electrical blade terminals are mounted in and extend outward from the housing for releasable insertion into jaw contacts of a meter socket. A plurality of jaw contacts are mounted in the adapter housing for electrically receiving blade terminals of the watthour meter The watthour meter socket adapter has the power switch disposed with a reduced height from the back wall of the housing to permit use of an unmodified, substantially solid safety shield in the adapter housing. The rocker type actuator switch has one end disposed in engagement with the on/off member of the power switch and an opposed external lever projecting through the side of the adapter housing for actuation or resetting of the power switch, as well as to provide a visual indication of the on/off condition of the power switch.

BRIEF DESCRIPTION OF THE DRAWINGS

The various features, advantages and other uses of the present invention will become more apparent by referring to the following detailed description and drawing in which.

FIG. 1 is an exploded, perspective view of a watthour meter and meter socket installation;

FIG. 2 is a front perspective view of the socket adapter and power switch shown in FIG. 1;

FIG. 3 is a side perspective view of the socket adapter and power switch shown in FIG. 1;

DETAILED DESCRIPTION

Figure 4A:
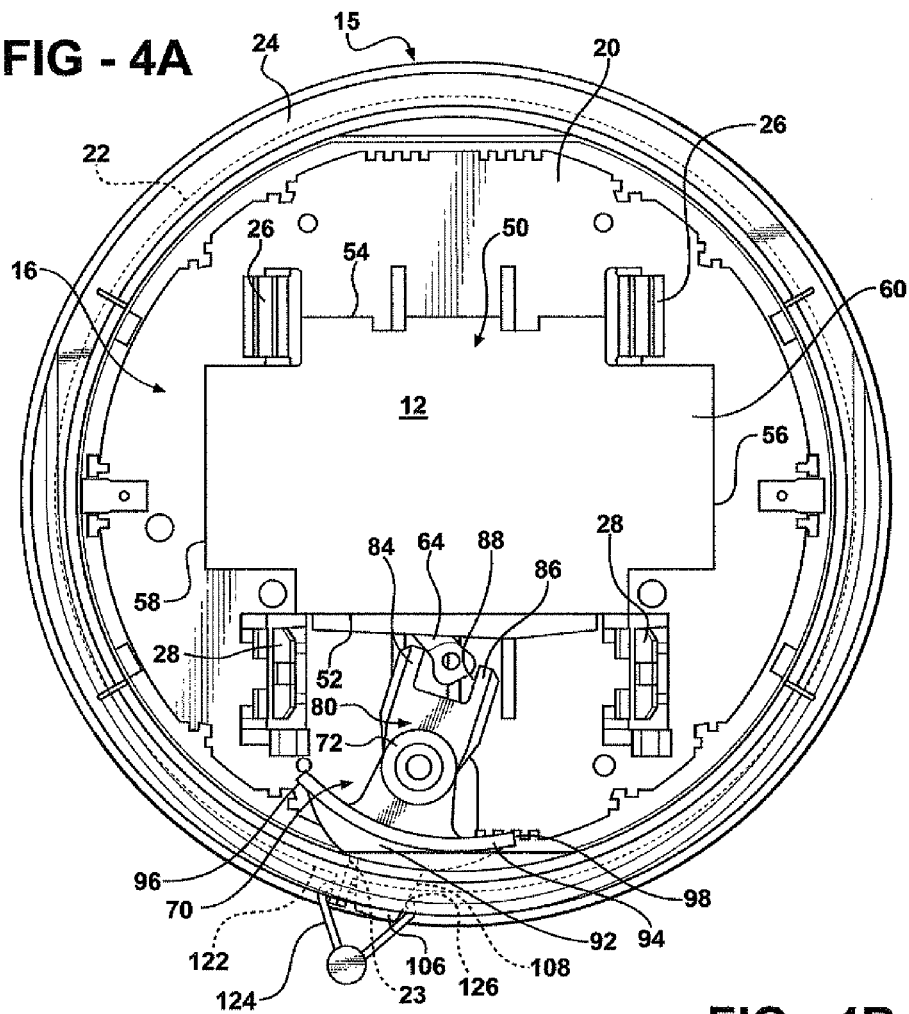
FIG. 4A is a front perspective view of the socket adapter and power switch without the safety shield showing the power switch and the actuator in the "off" position.

Referring to FIGS. 1-8, there is depicted an electrical metering service installation 10, which includes a power switch 12 and a safety shield 14 mounted in a watthour socket adapter 15 which is plug-in mountable meter in a socket 17.

The socket adapter 15 includes a housing 16 which is mountable on a wall or building surface. The housing 16 includes a base or rear wall 20 and a sidewall 22 extending therefrom and terminating in a peripheral flange 24. The base 20 and the sidewall 22 may be of one-piece molded construction or of a two-piece construction in which the sidewall 22 forms part of a shell which may include its own base spaced from the base or rear wall 20 of the housing 16.

A plurality of jaw-type contacts are mounted on the base 20. For single phase electrical power service, a pair of line jaw contacts 26 and a pair of low jaw contacts 28 are provided. The jaw contacts 26 and 28 may take any contact configuration and are typically mounted on a boss or directly to the base 20 by means of fasteners. A blade terminal 27 and 29 is respectively is respectively electrically coupled to each jaw contact 26 and 28 and projects externally from the base 20 for releasable mounting in jaw contacts 31 in the socket 17, such as a watthour meter socket 17. Electrical power conductors and the load distribution conductors, not shown, extend through the housing the socket 30 into contact with the socket jaw contacts 31.

The safety shield 14 formed of an electrically insulating material. The shield 14 is fixedly mounted in the housing 16 by means of fasteners, snap-in connections, etc. The shield 14 may take any shape to form a protective chamber around the jaw contacts 26 and 28 and the electrical conducting terminals and conductors in the housing 20.

A plurality of apertures 34 are formed in a front face 36 of the shield 14. The apertures 34 receive the blade terminals 35 of a watthour meter 37 to enable the blade terminals 35 to fixedly engage the jaw contacts 26 and 28 in the housing 16.

The power switch 12 selectively controls the supply of electrical power between one or more of the line and load jaw contacts 26 and 28 and the blade terminals 27 and 29 associated with each jaw contact 26 and 28. The power switch 12, which may be a power disconnect device, such as a circuit breaker, ground fault circuit interrupt device (GFCI), etc., has internal contacts connected to external terminals which are connected by conductors to the blade terminals 27 and 29 and the jaw contacts 26 and 28 in the housing 16. This enables the power connections between the jaw contacts 26 and 28 in the housing 16 to be selectively connected or disconnected from the blade terminals 27 and 29 and, thereby, from the line and load distribution conductors in the socket 17.

A typical power switch 12 has a cubicle housing 50 with a front surface 52, a rear surface 54, opposed side surfaces 56 and 58, a top surface 60, and an opposed, lower surface, not shown. The terms "front," "back," "side," "top" and "bottom" are used with reference to the normal mounting position of a power disconnect in the housing 16 wherein the rear surface 54 typically is mounted on the base 20 of the housing 16, and the front surface 52 faces outward toward the opening of the housing 16.

An on/off rocker member 64 is typically mounted on the front surface 52 of the housing 50 of the power switch 12 to allow manual switching of the internal contacts of the power switch 12 between conducting and non-conducting states. The rocker member 64 may move automatically to the off position when the circuit breaker or GFIC trips during an over-voltage, or an over-current or a ground or short circuit.

As shown in FIGS. 2-5, an actuator 70 is mounted in the housing 16 and coupled to the rocker member 64 on the housing 50. The actuator 70 is in the form of a rocker switch in that the actuator 70 is pivotally movable between first and second positions which correspond, by example only, to the "on" or conducting position and the "off" or non-conducting position of the rocker member 64 of the power switch 12.

The actuator 70, by example only, has a one-piece, molded or machined body formed of a suitable plastic or metallic material, either electrically insulating or non-insulating. The actuator 70 includes a stem 72 having a generally cylindrical shape with an internal bore 74 extending between first and second ends 76 and 78.

The stem 72 of the actuator 70 is pivotally mounted on the base 20 of the housing 16 by a pin or other pivotal connection means. Optionally, the pivot connection can include a generally cylindrical sleeve 75 which can be a separate element fixedly mounted to and projecting from the base 20 by means of a fastener extending through the base 20, or an integrally formed post on the base 20 or the shield 14. The sleeve 75 is fixed in position and receives the bore 74 of the stem 72 to allow pivotal movement of the entire actuator 70 and add rigidity to prevent binding of the actuator 70.

In this manner, the pivot axis of the actuator 70 and the pivot axis of the rocker member 64 are substantially co-axial and, also, substantially perpendicular to the rear wall or base 20 of the socket adapter housing 16.

A first portion 80 extends from one side of the stem 72. The first portion 80 is coupled, either permanently or releasibly, to the rocker member 64 by means of a rocker switch engagement feature such as a pin or other attachment member, or by a rocker member engagement feature, such as a recess or cavity in the end of the first portion 80 which encompasses the end of the rocker member 64, or is captured in a recess or cavity on the end of the rocker member 64. In another example, the first portion 80 includes an arm 81 having a generally solid base 82 from which two fingers or legs 84 and 86 extend. The fingers 84 and 86 are spaced by a slot 88 having an internal width slightly larger than the thickness of the on/off rocker member 64 of the power switch 12 for engagement with and simultaneous movement of the rocker member 64 and the external actuator 70. Lateral flanges 87 extend laterally outward from the outer surface of each finger 84 and 86 for added stiffness.

The actuator 70 also includes a second portion or arm 90 projecting from an opposite side of the stem 72. The second arm 90 includes a generally solid base 92. An arcuate flange 94 is mounted on one end of the base 92. The diameter of the flange 94 is approximate the inner diameter of the sidewall 22 of the housing 16, such that opposed ends 96 and 98 of the flange 94 freely slide along the inner surface of the sidewall 22 of the housing 16 between opposite edges of an aperture 23 formed in the sidewall 22 to substantially close off or cover the aperture 23 in any position of the actuator 70.

A boss 100 is formed on an outer side of the flange 94 and has an arcuate shape formed with a pair of arcuate surfaces 102 and 104. An intermediately disposed lever 106 projects from the arcuate surfaces 102 and 104 of the boss 100 and forms a user finger engagement surface to control manual pivotal movement of the actuator 70 as described hereafter. Opposed sides 108 of the lever 106 may be formed with serrations or other surface irregularities to form a solid finger grip surface.

Figure 4B:
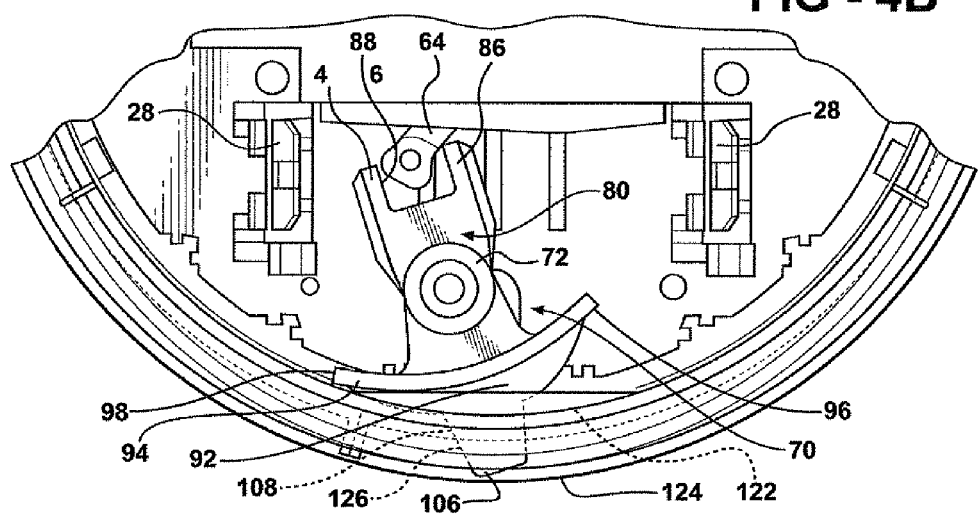
FIG. 4B is a partial, front perspective view, similar to FIG. 4A, but showing the power switch and the actuator in the "on" position.
Figure 5:
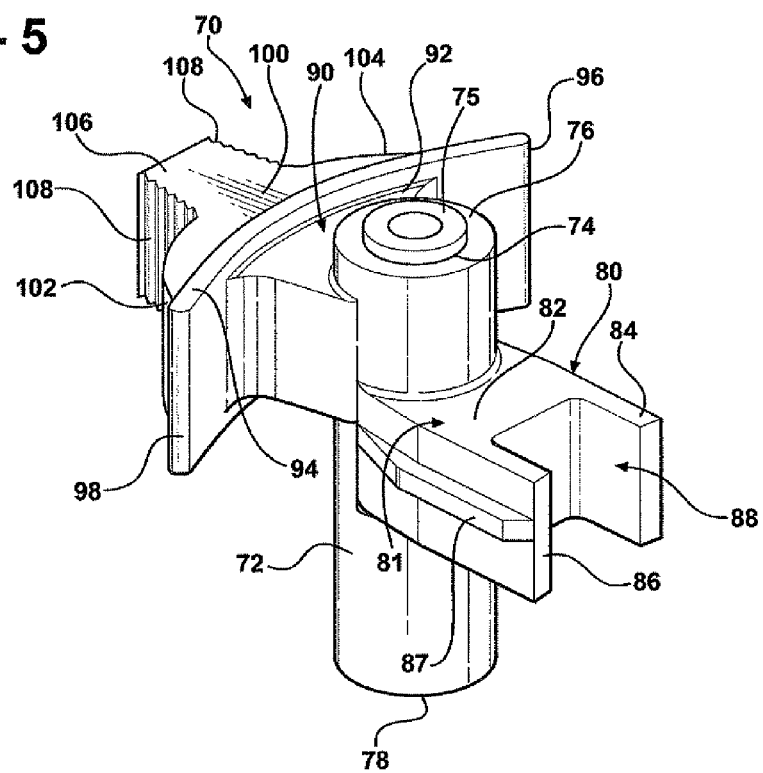
FIG. 5 is an enlarged perspective view of the actuator.
Figure 6:
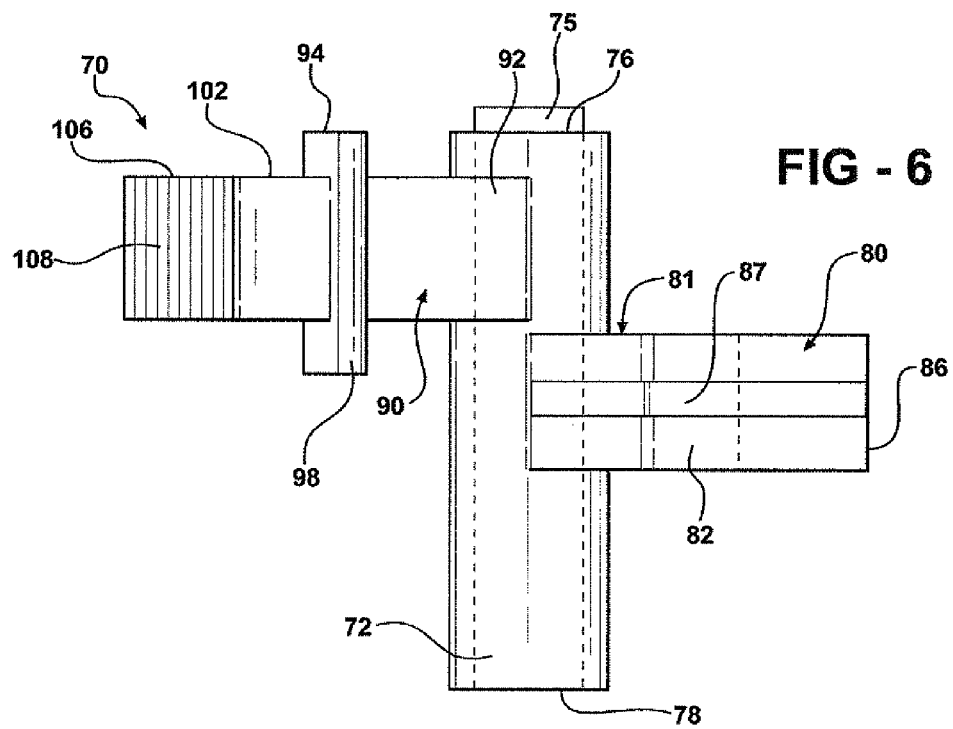
FIG. 6 is a front elevational view of the actuator shown in FIG. 5.
Figure 7:
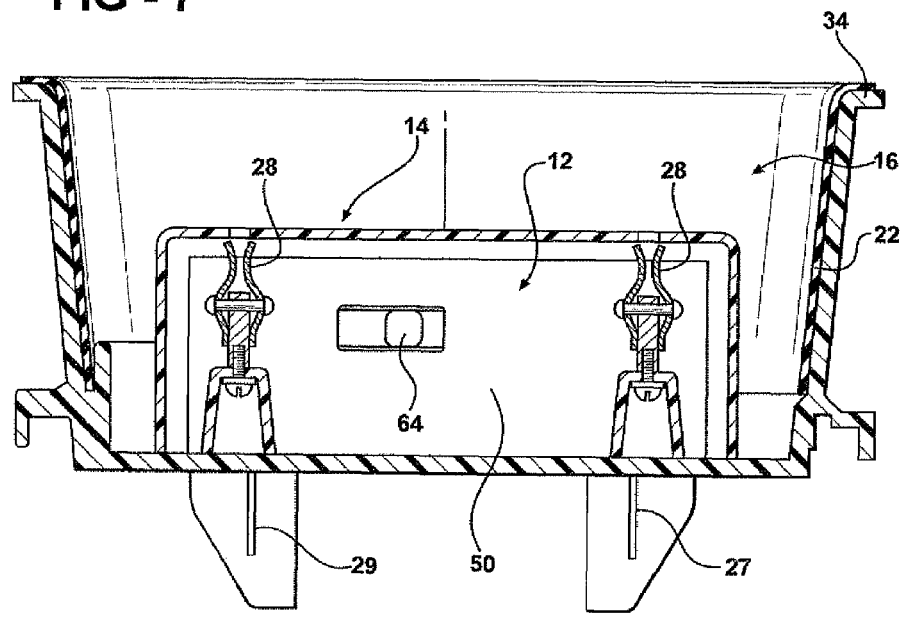
FIG. 7 is a cross-sectional view generally taken along line 8-8 in FIG. 2.
Figure 8:
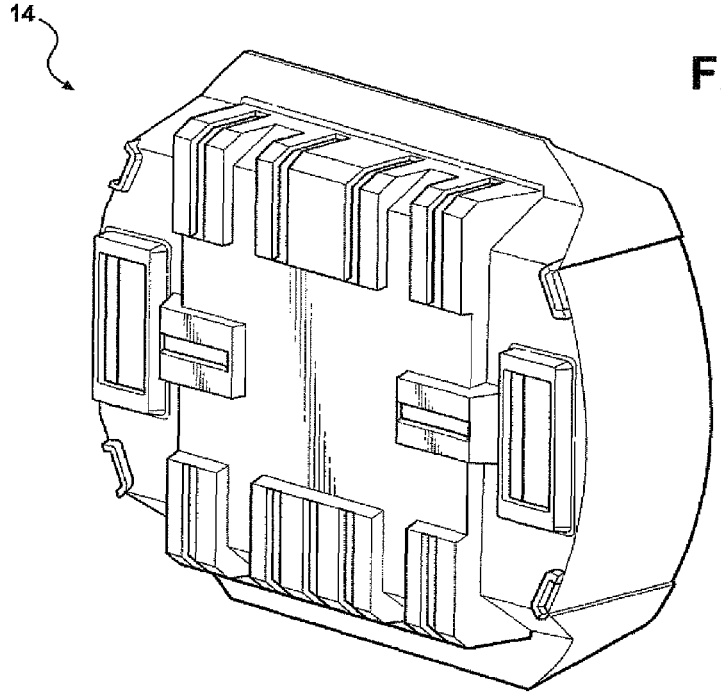
FIG. 8 is a perspective view of the safety shield shown in FIGS. 1-3.

As shown in FIGS. 2-4, a portion of the boss 100 and the entire lever 106 project externally from the sidewall 22 of the housing 16. The aperture 23 in the sidewall 22 is sized to allow pivotal movement of the actuator 70 between a first lever "off" or conducting state position of the power switch 12 shown in FIGS. 2, 3 and 4A, and a second lever position corresponding to an "on" or non-conducting position of the power switch 12 shown in FIG. 4B.

In operation, since the first arm 81 of the actuator 70 is coupled to the rocker member 64 of the power switch 12, any movement of the rocker member 64, such as movement caused by a detected over-voltage or over-current condition, a ground fault, or an external power on or off signal, etc., causes the actuator 70 to likewise pivot from one of the first and second positions to the other of the first and second positions.

As seen in FIG. 4A, which represents the "off" position of the rocker member 64 and the actuator 70, are spaced apart slightly farther than the thickness of the rocker member 64. This provides a loose fit allowing the tip ends of the fingers 84 and 86 to slide along the sides of the rocker member 64 to exert a substantially simultaneous pivotal interaction between the rocker member 64 and the actuator 70.

Suitable indicia may be provided on the arcuate surfaces 102 and 104 of the boss 100 on the actuator 70 or on the external surface of the sidewall 22 of the housing 16 on the sides of the aperture 23 to indicate the "on" and "off" positions of the actuator 70. It will also be understood that a visual indication of the state of the power switch 12 may be provided merely by the position of the lever 106 of the actuator 70 relative to the aperture 23.

The actuator 70 also provides a manual connect or disconnect control of the power switch 12. Using the lever 106, a utility service person can switch and the power switch 12 between the "on" and "off" positions. This enables a safe power off removal and reconnection of the watthour meter 37 to the jaw contacts 26 and 28 in the housing 16, as well as a direct connection of power between the jaw contacts 26 and 28 when the watthour meter 37 is removed from the housing 16.

To achieve the illustrated pivotally movable positioning of the actuator 70, the housing 50 of the power switch 12 is mounted on the base 20 of the housing 16 by disposing the lower surface of the housing 50 in close proximity to or in direct contact with the base 20. This spaces the front surface 52 of the housing 50 from the sidewall 22 of the housing 16 with the rocker member 64 facing the aperture 23 in the sidewall 22 of the adapter housing 16.

It will be understood that the aperture 23 may be provided on the opposite 180° spaced portion of the sidewall 22 of the housing 16 and the power switch 12 oriented with the side 56 facing the base 20 of the housing 16 to position the actuator 70 on an opposite side of the adapter housing 16.

As shown in FIG. 4, an optional lock means 120 may be provided to lock the actuator 70 in the "off" position. A flange 122 is fixed on an exterior surface of the sidewall 22. Apertures 124 and 126 in the flange 122 and the lever 106 receive a wire seal or other lock 128, for example. A similar flange 122 may be mounted on the opposed edge of the aperture 23 to provide a lock position of the actuator 70 and the power switch in the "on" position.

What is claimed is:

1. A watthour meter socket adapter mountable in a socket having a plurality of jaw contacts and receiving a watthour meter, the socket adapter comprising:
    a housing having a base and a sidewall;
    a power switch disposed in the housing, the power switch having a rocker member;
    an aperture formed in the sidewall of the housing; and
    an actuator pivotally disposed in the housing, the actuator having a first portion coupled to the rocker member on the power switch for joint movement of the rocker member and the actuator, the actuator having a second portion, at least a portion of the second portion extending through the aperture in the sidewall and terminating in a user engagable member.

2. The adapter of claim 1 wherein:
    the user engagable member of the actuator is a lever.

3. The adaptor of claim 1 wherein:
    the first portion and the rocker member have engageable surfaces.

4. The adapter of claim 3 wherein the engageable surfaces comprises first and second spaced fingers engaging the rocker member of the power switch.

5. The adapter of claim 1 wherein the first portion comprises:
    first and second spaced fingers capturing the rocker member of the power switch.

6. The adapter of claim 1 wherein the actuator further comprises:
    a stem pivotally mounted in the housing.

7. The adapter of claim 6 further comprising:
    a sleeve fixedly extending from the base of the housing, the stem pivotally mounted about the sleeve.

8. The adapter of claim 1 further comprising:
    a plurality of electrical blade terminals dispersed in and extending outward from the base of the housing for releasable insertion into jaw contacts of a socket;
    a plurality of jaw contacts mounted in the housing adapted for electrically receiving blade terminals of a watthour meter;
    a shield mounted in the housing and disposed over the jaw contacts; and apertures formed in the shield allowing passage of watthour meter blade terminals through the shield and into engagement with the jaw contacts in the housing.

9. The adapter of claim 8 wherein:
the power switch is a power disconnect device having electrical contacts connected to the blade terminals and the jaw contacts in the housing.

10. The adapter of claim 8 further comprising:
an aperture formed in a side of the shield; and
the first portion of the external actuator extending through the aperture in the side of the shield.

11. The adapter of claim 1 further comprising:
a pivot axis of the rocker member being substantially parallel to a pivot axis of the actuator.

12. The adapter of claim 1 further comprising:
a pivot axis of the rocker member and a pivot axis of the actuator being substantially perpendicular to the base of the housing.

13. The adapter of claim 1 wherein the actuator comprises:
a flange extending from the user engagable member and substantially closing the aperture in all positions of the actuator.

14. The adapter of claim 1 further comprising:
a lock member carried on the housing and locking the user engagable member of the actuator in at least one of a first and a second position.

15. The adapter of claim 14 further comprising:
the lock member including a flange mounted on the housing and having an aperture;
an aperture formed in the user engagable member;
a lock mountable through the apertures in the user engagable member and the flange.

16. A watthour meter socket adapter mountable in a socket having a plurality of jaw contacts and receiving a watthour meter, the socket adapter comprising:
a housing having a base and a sidewall;
a power switch disposed in the housing, the power switch having a rocker member having a pivot axis substantially perpendicular to the base of the housing;
an aperture formed in the sidewall of the housing; and
an actuator pivotally disposed in the housing with a pivot axis substantially parallel to the pivot axis of the rocker switch, the actuator having a first portion including first and second spaced fingers coupled to the rocker member on the power switch for joint movement of the rocker member and the actuator, the actuator having a second portion, at least a portion of the second portion extending through the aperture in the sidewall and terminating in a user engagable lever.

17. The adapter of claim 16 wherein the actuator further comprises:
a stem pivotally mounted in the housing.

18. The adapter of claim 17 further comprising:
a sleeve fixedly extending from the base of the housing, the stem pivotally mounted about the sleeve.

19. The adapter of claim 16 wherein the actuator comprises:
a flange extending from the user engagable member and substantially closing the aperture in all positions of the actuator.

20. The adapter of claim 14 further comprising:
a lock member carried on the housing and locking the user engagable member of the actuator in at least one of a first and a second position.

21. The adapter of claim 20 further comprising:
the lock member including a flange mounted on the housing and having an aperture;
an aperture formed in the user engagable member;
a lock mountable through the apertures in the user engagable member and the flange.

* * * * *